United States Patent
Lee et al.

(10) Patent No.: US 10,686,326 B2
(45) Date of Patent: Jun. 16, 2020

(54) WIRELESS POWER TRANSMITTER AND WIRELESS POWER RECEIVER

(71) Applicant: Samsung Electronics Co., Ltd., Gyeonggi-do (KR)

(72) Inventors: Chong-Min Lee, Seoul (KR); Yu-Su Kim, Gyeonggi-do (KR); Hyung-Koo Chung, Gyeonggi-do (KR); Hyo-Seok Han, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/778,689

(22) PCT Filed: Nov. 23, 2016

(86) PCT No.: PCT/KR2016/013516
§ 371 (c)(1),
(2) Date: May 24, 2018

(87) PCT Pub. No.: WO2017/090964
PCT Pub. Date: Jun. 1, 2017

(65) Prior Publication Data
US 2018/0358833 A1  Dec. 13, 2018

(30) Foreign Application Priority Data
Nov. 25, 2015  (KR) .................. 10-2015-0165319

(51) Int. Cl.
*H02J 7/02* (2016.01)
*H02J 50/12* (2016.01)
(Continued)

(52) U.S. Cl.
CPC ............ *H02J 7/025* (2013.01); *H02J 50/12* (2016.02); *H02J 50/40* (2016.02); *H02J 50/70* (2016.02);
(Continued)

(58) Field of Classification Search
CPC .. H02J 7/025; H02J 50/12; H02J 50/40; H02J 50/70; H05K 3/46; H05K 2201/0723;
(Continued)

(56) References Cited

U.S. PATENT DOCUMENTS 5,781,074 A  7/1998  Nguyen et al.
8,436,491 B2  5/2013  Walley et al.
(Continued)

FOREIGN PATENT DOCUMENTS

JP  2005322861  11/2005
JP  2015053770  3/2015
(Continued)

OTHER PUBLICATIONS

PCT/ISA/210 Search Report issued on PCT/KR2016/013516 (pp. 3).
PCT/ISA/237 Written Opinion issued on PCT/KR2016/013516 (pp. 4).

*Primary Examiner* — Richard Isla
*Assistant Examiner* — Manuel Hernandez
(74) *Attorney, Agent, or Firm* — The Farrell Law Firm, P.C.

(57) ABSTRACT

A wireless power receiver for wirelessly receiving power from a wireless power transmitter comprises: a power reception circuit receiving electromagnetic waves emitted from the wireless power receiver so as to output power having an alternating current waveform; a rectifier for rectifying the power, having an AC waveform, outputted from the power reception circuit into power having a direct current waveform; a DC/DC converter for converting, into a voltage of a preset level, a voltage of the power having a direct current waveform, the power being rectified by the rectifier; a charger for charging a battery by using the power having a DC waveform, converted from the DC/DC converter; an alternating current ground connected to the power reception circuit and/or the rectifier so as to receive at least a portion of the power having an alternating current waveform; and a direct current ground connected to the DC/DC converter and/or the charger so as to receive at least a portion of the power having a direct current waveform, wherein the alter- (Continued)

nating current ground and the direct current ground can be disposed on different PCB layers, respectively.

14 Claims, 11 Drawing Sheets

(51) Int. Cl.
    *H02J 50/40*     (2016.01)
    *H02J 50/70*     (2016.01)
    *H05K 1/02*     (2006.01)
    *H05K 3/46*     (2006.01)

(52) U.S. Cl.
    CPC .......... *H05K 1/0218* (2013.01); *H05K 1/0224* (2013.01); *H05K 3/46* (2013.01); *H05K 2201/0723* (2013.01); *H05K 2201/09354* (2013.01); *H05K 2201/09972* (2013.01)

(58) Field of Classification Search
    CPC .......... H05K 2201/09354; H05K 2201/09972; H05K 1/0218; H05K 1/0224
    USPC ........................................................ 320/108
    See application file for complete search history.

(56) References Cited

U.S. PATENT DOCUMENTS

| | | | | |
|---|---|---|---|---|
| 2007/0069932 | A1* | 3/2007 | Isoda | ............ H01L 23/50 341/143 |
| 2007/0288873 | A1 | 12/2007 | Kobayashi et al. | |
| 2009/0080135 | A1* | 3/2009 | Major | ............ H01L 23/60 361/220 |
| 2010/0013064 | A1* | 1/2010 | Hsu | ............ H01L 23/055 257/660 |
| 2010/0258905 | A1* | 10/2010 | Song | ............ H01L 23/66 257/532 |
| 2011/0127845 | A1* | 6/2011 | Walley | ............ H02J 5/005 307/104 |
| 2011/0130093 | A1* | 6/2011 | Walley | ............ G06K 7/10207 455/41.1 |
| 2011/0222247 | A1* | 9/2011 | Motohashi | ............ H05K 1/0227 361/748 |
| 2013/0099734 | A1* | 4/2013 | Lee | ............ H02J 7/007 320/108 |
| 2013/0200844 | A1 | 8/2013 | Lee et al. | |
| 2015/0233990 | A1 | 8/2015 | Lee et al. | |
| 2016/0302303 | A1* | 10/2016 | Kim | ............ H05K 1/0218 |
| 2016/0315503 | A1* | 10/2016 | Park | ............ H02J 50/80 |
| 2016/0345429 | A1* | 11/2016 | Ishiwata | ............ H05K 1/0218 |
| 2018/0053654 | A1* | 2/2018 | Makino | ............ H05K 1/00 |
| 2018/0168039 | A1* | 6/2018 | Numagi | ............ H01L 23/48 |

FOREIGN PATENT DOCUMENTS

| | | |
|---|---|---|
| KR | 1020120131015 | 12/2012 |
| KR | 1020130090703 | 8/2013 |
| KR | 1020140060980 | 5/2014 |
| KR | 1020150098222 | 8/2015 |

* cited by examiner

WIRELESS POWER TRANSMITTER AND WIRELESS POWER RECEIVER

PRIORITY

This application is a National Phase Entry of International Application No. PCT/KR2016/013516, which was filed on Nov. 23, 2016, and claims priority to Korean Patent Application No. 10-2015-0165319, which was filed on Nov. 25, 2015, the contents of each of which are incorporated herein by reference.

TECHNICAL FIELD

The present disclosure relates to a wireless power transmitter and a wireless power receiver and, specifically, relates to a wireless power transmitter configured to wirelessly transmit power to a wireless power receiver and a wireless power receiver configured to wirelessly receive power from a wireless power transmitter.

BACKGROUND ART

Mobile terminals such as a mobile phone, a Personal Digital Assistant (PDA), and the like are driven with rechargeable batteries due to their nature, and the battery of the mobile terminal is charged through supplied electric energy by using a separate charging apparatus. Typically, the charging device and the battery have separate contact terminals at an exterior thereof, respectively, and are electrically connected with each other by contacting the contact terminals.

However, in such a contact-type charging scheme, the contact terminals protrude outwardly, and thus are easily contaminated by foreign substances. As a result, battery charging may not be correctly performed. Further, the battery charging may also not be correctly performed in a case where the contact terminal is exposed to moisture.

Recently, a wireless charging or a non-contact charging technology has been developed and used for electronic devices to solve the above-mentioned problem.

The wireless charging technology uses wireless power transmission and reception, and corresponds to, for example, a system in which a battery is automatically charged if the battery is put on a charging pad without connecting the mobile phone to a separate charging connector. The wireless charging technology is generally known to be used for a wireless electric toothbrush or a wireless electric shaver. The wireless charging technology can improve a waterproof function because it can be used to wirelessly charge the electronic devices. The wireless charging technology can improve the portability of the electronic devices because it does not require a wired charger. Therefore, it is expected that technologies related to the wireless charging technology will be significantly developed in the coming age of electric cars.

The wireless charging technology largely includes an electromagnetic induction scheme using a coil, a resonance scheme using resonance, and an RF/microwave radiation scheme converting electrical energy to a microwave and then transmitting the microwave.

It is considered up to now that the electromagnetic induction scheme is mainstream, but it is expected that the day will come when all electronic products are wirelessly charged, anytime and anywhere, without a wire in the near future on the strength of recent successful experiments configured to wirelessly transmit power to a destination spaced away by dozens of meters through the use of microwaves at home and abroad.

A power transmission method through the electromagnetic induction corresponds to a scheme of transmitting electric power between a first coil and a second coil. When a magnetic is moved in a coil, an induction current occurs. By using the induction current, a magnetic field is generated at a transmitting end, and an electric current is induced according to a change in the magnetic field so as to generate energy at a receiving end. The phenomenon is referred to as magnetic induction, and the power transmission method using magnetic induction has a high energy transmission efficiency.

With respect to the resonance scheme, Prof. Soljacic of MIT announced a system in which electricity is wirelessly transferred using an electric power transmission principle of the resonance scheme based on a coupled mode theory even if a device to be charged is separated from a charging device by several meters. The wireless charging system of the MIT team employs a concept in physics that resonance is the tendency in which when a tuning fork oscillates at a particular frequency, a wine glass next to the tuning fork oscillates at the same frequency. The research team makes an electromagnetic wave containing electrical energy resonate instead of making sounds resonate. It is known that the resonant electrical energy does not affect surrounding machines or human bodies differently from other electromagnetic waves because the resonant electrical energy is directly transferred only to a device having a resonance frequency and unused parts are reabsorbed into an electromagnetic field instead of spreading into the air.

DETAILED DESCRIPTION OF THE INVENTION

Technical Problem

Conventional wireless power transmitters and wireless power receivers can cause electro-magnetic interference (EMI). The EMI can signify that an electromagnetic wave directly radiated or conducted from an electronic device affects a function of another electronic device. In order to reduce the EMI, a conventional wireless power receiver includes an impedance matching circuit, a filter, and a shielding element. However, those elements added to the conventional wireless power receiver increase the entire volume and weight of the wireless power receiver and thus makes it difficult to reduce a size of the wireless power receiver. Particularly, since filters have large volume and capacity, it is difficult to apply a filter to a small-sized product, such as a mobile device. In addition, even if a filter is adopted, EMI is not completely reduced. Further, inclusion of various passive elements causes a problem of increased cost.

Various embodiments of the present disclosure can provide a wireless power transmitter and a wireless power receiver, which have a structure separating an alternating current ground layer and a direct current ground layer to reduce EMI.

Technical Solution

According to various embodiments of the present disclosure, a wireless power receiver configured to wirelessly receive power from a wireless power transmitter includes: a power reception circuit configured to receive an electromagnetic wave emitted from the wireless power receiver to output a power in an alternating current waveform; a rectifier configured to rectify the power in the alternating current waveform output from the power reception circuit, to a power in a direct current waveform; a DC/DC converter configured to convert a voltage of the power in the direct current waveform from the rectifier into a predetermined level; a charger configured to charge a battery with the converted power in the direct current waveform from the DC/DC converter; an alternating current ground connected to at least a part of the power reception circuit and the rectifier to receive at least part of the power in the alternating current waveform; and a direct current ground connected to at least a part of the DC/DC converter and the charger to receive at least part of power in the direct current waveform, wherein the alternating current ground and the direct current ground are arranged on PCB layers different from each other, respectively.

According to various embodiments of the present disclosure, a wireless power transmitter configured to wirelessly provide power to a wireless power receiver includes: a power provider configured to provide a power in a direct current waveform; an amplifier configured to amplify the power in the direct current waveform with a predetermined gain; an inverter configured to invert the amplified power in the direct current waveform to a power in an alternating current waveform; a power transmission circuit configured to emit an electromagnetic wave by using the power in the alternating current waveform; an alternating current ground connected to at least a part of the power transmission circuit and the inverter to receive at least part of the power in the alternating current waveform; and a direct current ground connected to at least a part of the power provider and the amplifier to receive at least part of the power in the direct current waveform, wherein the alternating current ground and the direct current ground are arranged on different PCB layers from each other, respectively.

According to various embodiments of the present disclosure, an electronic device configured to process a power in an alternating current waveform and a power in a direct current waveform includes: an alternating current circuit configured to process the power in the alternating current waveform; a power in a direct current waveform configured to process the power in the direct current waveform; an alternating current ground connected to at least a part of the alternating current circuit to receive at least part of the power in the alternating current waveform; and a direct current ground connected to at least a part of the direct current circuit to receive at least part of the power in the direct current waveform, wherein the alternating current ground and the direct current ground are arranged on different PCB layers from each other, respectively.

Advantageous Effects

Various embodiments of the present disclosure can provide a wireless power transmitter and a wireless power receiver, which have a structure separating an alternating current ground layer and a direct current ground layer to reduce EMI. Accordingly, the present disclosure can reduce the EMI without a particular additional element, and weight and volume of an entire device can thus be reduced. Further, without including a passive element, the EMI can be reduced and the increased cost by the passive element can thus be prevented.

MODE FOR CARRYING OUT THE INVENTION

Figure 1:
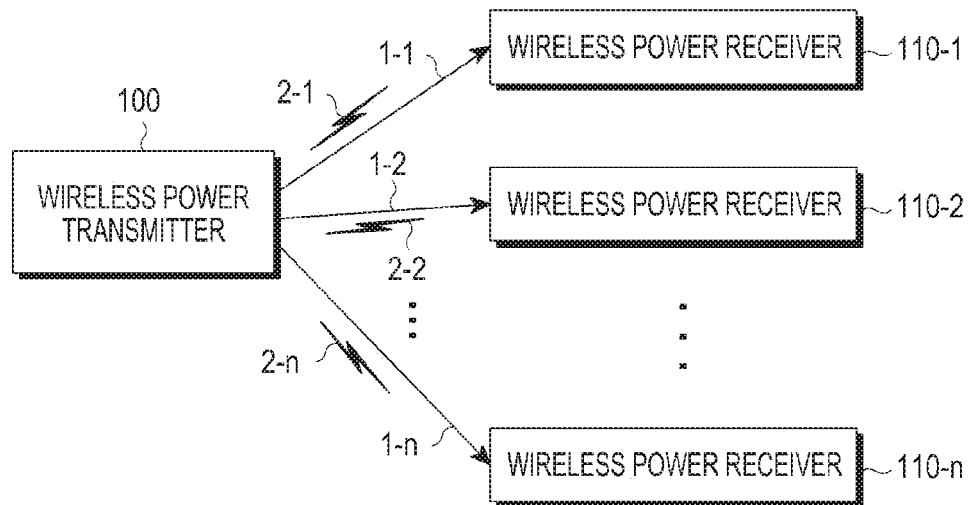
FIG. 1 illustrates a concept describing general operations of a wireless charging system.

Hereinafter, various embodiments of the present disclosure will be described with reference to the accompanying drawings. However, it should be understood that there is no intent to limit the present disclosure to the particular forms disclosed herein; rather, the present disclosure should be construed to cover various modifications, equivalents, and/or alternatives of embodiments of the present disclosure. In describing the drawings, similar reference numerals may be used to designate similar constituent elements.

As used herein, the expression "have", "may have", "include", or "may include" refers to the existence of a corresponding feature (e.g., numeral, function, operation, or constituent element such as component), and does not exclude one or more additional features.

In the present disclosure, the expression "A or B", "at least one of A or/and B", or "one or more of A or/and B" may include all possible combinations of the items listed. For example, the expression "A or B", "at least one of A and B", or "at least one of A or B" refers to all of (1) including at least one A, (2) including at least one B, or (3) including all of at least one A and at least one B.

The expression "a first", "a second", "the first", or "the second" used in various embodiments of the present disclosure may modify various components regardless of the order and/or the importance but does not limit the corresponding components. For example, a first user device and a second user device indicate different user devices although both of them are user devices. For example, a first element may be termed a second element, and similarly, a second element may be termed a first element without departing from the scope of the present disclosure.

It should be understood that when an element (e.g., first element) is referred to as being (operatively or communicatively) "connected," or "coupled," to another element (e.g., second element), it may be directly connected or coupled directly to the other element or any other element (e.g., third element) may be interposed between them. In contrast, it may be understood that when an element (e.g., first element) is referred to as being "directly connected," or "directly coupled" to another element (second element), there are no element (e.g., third element) interposed between them.

The expression "configured to" used in the present disclosure may be exchanged with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may mean that the device, together with other devices or components, "is able to". For example, the phrase "processor adapted (or configured) to perform A, B, and C" may mean a dedicated processor (e.g. embedded processor) only for performing the corresponding operations or a generic-purpose processor (e.g., central processing unit (CPU) or application processor (AP)) that can perform the corresponding operations by executing one or more software programs stored in a memory device.

The terms used herein are merely for the purpose of describing particular embodiments and are not intended to limit the scope of other embodiments. A singular expression may include a plural expression unless they are definitely different in a context. Unless defined otherwise, all terms used herein, including technical and scientific terms, have the same meaning as those commonly understood by a person skilled in the art to which the present disclosure pertains. Such terms as those defined in a generally used dictionary may be interpreted to have the meanings equal to the contextual meanings in the relevant field of art, and are not to be interpreted to have ideal or excessively formal meanings unless clearly defined in the present disclosure. In some cases, even the term defined in the present disclosure should not be interpreted to exclude embodiments of the present disclosure.

FIG. 1 illustrates a concept describing general operations of a wireless charging system. As shown in FIG. 1, the wireless charging system includes a wireless power transmitter 100 and one or more wireless power receivers 110-1, 110-2, . . . , and 110-n.

The wireless power transmitter 100 may wirelessly transmit power 1-1, 1-2, and 1-n to the one or more wireless power receivers 110-1, 110-2, . . . , and 110-n, respectively.

The wireless power transmitter 100 may form an electrical connection with the wireless power receivers 110-1, 110-2, . . . , and 110-n. For example, the wireless power transmitter 100 may transmit wireless power by radiating an electromagnetic field or a magnetic field. The wireless power transmitter 100 may transmit wireless power on the basis of an induction scheme or a resonance scheme.

Meanwhile, the wireless power transmitter 100 may perform bidirectional communication with the wireless power receivers 110-1, 110-2, . . . , and 110-n. In out-band type communication, the wireless power transmitter 100 and the wireless power receivers 110-1, 110-2, . . . , and 110-n may process packets 2-1, 2-2, . . . , 2-n including a predetermined number of frames, or transmit or receive the packets. Particularly, the wireless power receivers may be implemented as a small domestic appliance, such as a mobile communication terminal, a PDA, a PMP, a smartphone, a wearable electronic device, a mobile music reproducing device, etc., a major appliance, such as a refrigerator, a TV, etc., and an electronic vehicle, etc. In in-band type communication, the wireless power receivers 110-1, 110-2, and 110-n may perform load modulation and the wireless power transmitter 100 may acquire reports of the wireless power receivers 110-1, 110-2, . . . , and 110-n according to detection of the load change.

The wireless power transmitter 100 may wirelessly provide power to a plurality of wireless power receivers 110-1, 110-2, . . . , and 110-n. For example, the wireless power transmitter 100 may transmit power to the plurality of wireless power receivers 110-1, 110-2, . . . , and 110-n through the resonance scheme. When the wireless power transmitter 100 adopts the resonance scheme, distances between the wireless power transmitter 100 and the wireless power receivers 110-1, 110-2, . . . , and 110-n may be distances for the operation in an indoor environment. Further, when the wireless power transmitter 100 adopts an electromagnetic induction scheme, it is preferable that the distances between the wireless power transmitter 100 and the plurality of wireless power receivers 110-1, 110-2, . . . , and 110-n are 10 cm or shorter. When the wireless power transmitter 100 uses the RF/microwave radiation scheme, a microwave power beam having directivity is formed to charge at least one of the plurality of wireless power receivers 110-1, 110-2, and 110-n.

The wireless power receivers 110-1, 110-2, . . . , and 110-n may receive wireless power from the wireless power transmitter 100 to charge batteries disposed therein. Further, the wireless power receivers 110-1, 110-2, . . . , and 110-n may transmit a signal configured to request a wireless power transmission, information necessary for a wireless power reception, information on statuses of the wireless power receivers, or information on a control of the wireless power transmitter 100 to the wireless power transmitter 100.

In addition, the wireless power receivers 110-1, 110-2, . . . , and 110-n may transmit a message indicating a charging state of each of the receivers to the wireless power transmitter 100 in the in-band type or out-band type.

The wireless power transmitter 100 may include a display means such as a display, and display a state of each of the wireless power receivers 110-1, 110-2, . . . , and 110-n on the basis of the message received from each of the wireless power receivers 110-1, 110-2, . . . , and 110-n. The wireless power transmitter 100 may also display an expected time period until each of the wireless power receivers 110-1, 110-2, . . . , and 110-n is completely charged.

Figure 2:
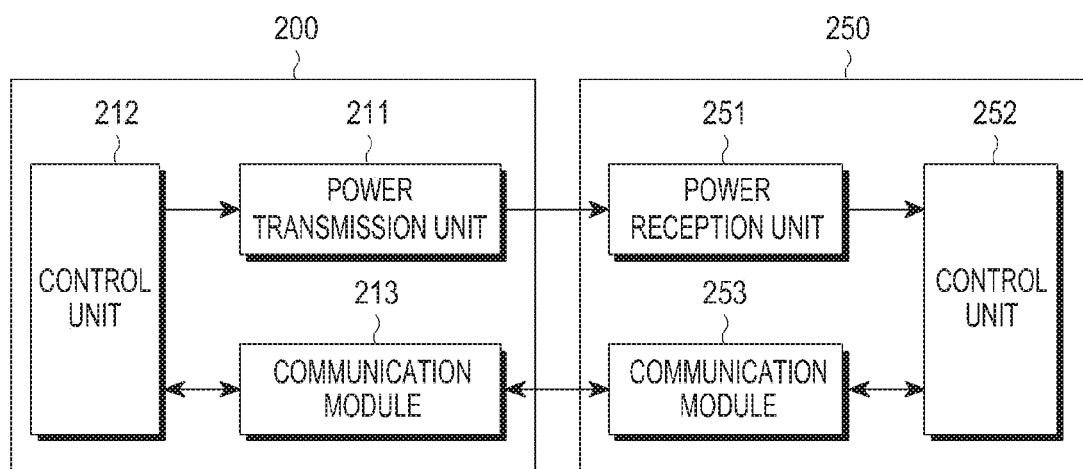
FIG. 2 is a block diagram illustrating a wireless power transmitter and a wireless power receiver according to an embodiment of the present disclosure.

FIG. 2 is a block diagram illustrating a wireless power transmitter and a wireless power receiver according to an embodiment of the present disclosure.

Referring to FIG. 2, the wireless power transmitter 200 may include a power transmission unit 211, a control unit 212, and a communication module 213. Further, the wireless power receiver 250 may include a power reception unit 251, a control unit 252, and a communication module 253.

The power transmission unit 211 may provide power to the wireless power receiver 250. The power transmission unit 211 may emit an electromagnetic field or a magnetic field on the basis of the resonance scheme, the induction scheme, or the RF/microwave radiation scheme. The power transmission unit 211 may include at least one of a resonance circuit and an inducing circuit, resulting in a transmission or a reception of desired electromagnetic waves. When the power transmission unit 211 is implemented by the resonance circuit, inductance L of a loop coil of the resonance circuit may be changed. Meanwhile, it will be easily understood by one skilled in the art that the power transmission unit 211 has no limitation as long as the power transmission unit 211 is a means capable of transmitting an electromagnetic field or a magnetic field.

The control unit 212 may control overall operations of the wireless power transmitter 200. The control unit 212 or the control unit 252 may control the general operation of the wireless power transmitter 200 or the wireless power receiver 250 by using an algorithm, a program, or an application, required for the control, read from a memory (not shown).

The communication module 213 may communicate with the wireless power receiver 250 or another electronic device in a predetermined manner. The communication module 213 may communicate with the communication module 253 of the wireless power receiver 250 by using a Near Field Communication (NFC) scheme, a Zigbee communication scheme, an infrared communication scheme, a visible ray communication scheme, a Bluetooth communication scheme, a Bluetooth Low Energy (BLE) scheme, Magnetic Secure Transfer (MST) scheme, or the like. Meanwhile, the above-described communication schemes are merely illustrative, and the scope of the embodiments of the present disclosure is not limited to a specific communication scheme that is performed by the communication module 213.

The power reception unit 251 may receive wireless power from the power transmission unit 211 on the basis of the induction scheme or the resonance scheme.

FIGS. 3A to 3D are circuit diagrams according to comparative examples to be compared with the present disclosure.

Figure 3A:
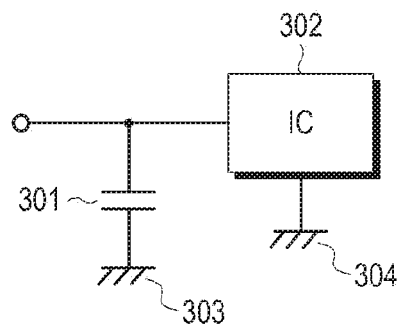
FIGS. 3A to 3D are circuit diagrams according to comparative examples to be compared with the present disclosure.

Referring FIG. 3A, an electronic device according to comparative examples may include a capacitor 301 having one end connected to an integrated circuit (IC) 302 and having the other end connected to a ground 303. The IC 302 may be connected to a ground 304. That is, the electronic device according to comparative examples may include a capacitive type filter.

Figure 3B:
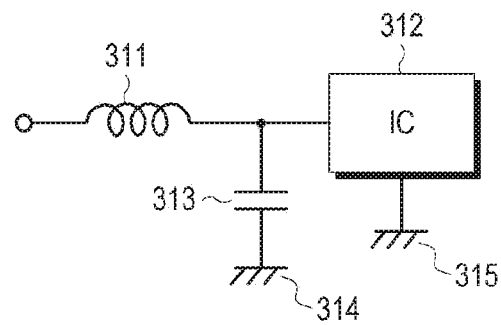

Referring FIG. 3B, an electronic device according to comparative examples may include an inductor 311 having the other end connected to an IC 312 and one end of a capacitor 313. The other end of the capacitor 313 may be connected to a ground 314 and an IC 312 may be connected to a ground 315. That is, the electronic device according to comparative examples may include an inductor type filter.

Figure 3C:
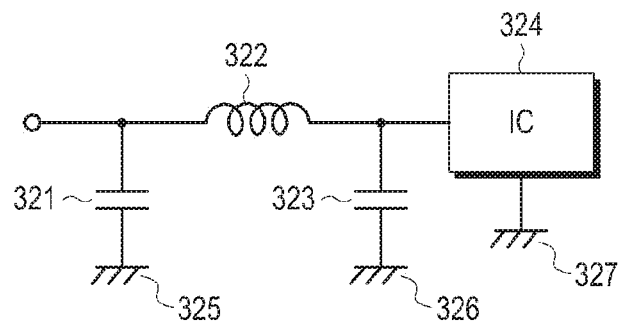

Referring FIG. 3C, an electronic device according to comparative examples may include an inductor 322 having one end connected to one end of a capacitor 321 and having the other end connected to an IC 324 and one end of a capacitor 323. The other end of the capacitor 321 may be connected to a ground 325, the other end of the capacitor 323 may be connected to a ground 326, and an IC 324 may be connected to a ground 327. That is, the electronic device according to comparative examples may include a π-section filter.

Figure 3D:
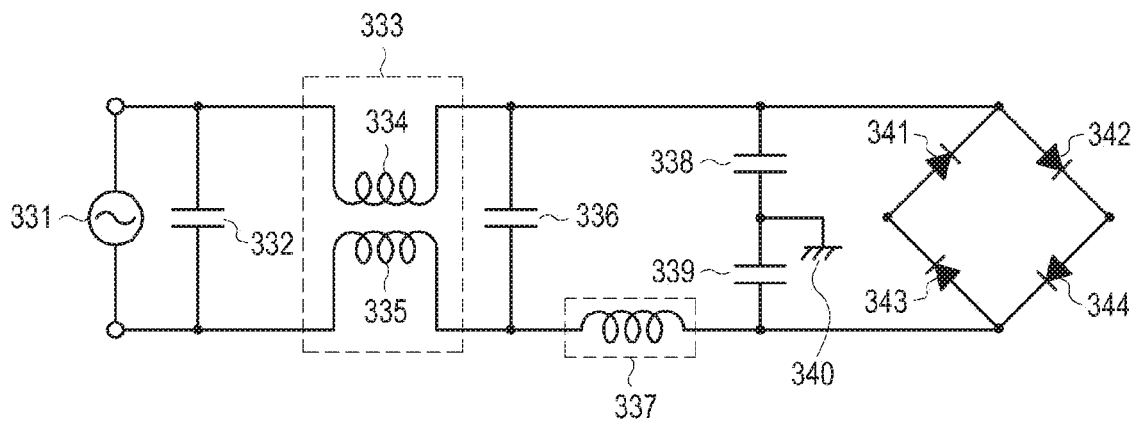

Referring FIG. 3D, an electronic device according to comparative examples may include a current source 331. The current source 331 may be connected in parallel with a capacitor 332. The capacitor 332 may be connected to a coil part 333 and the coil part 333 may include a first coil 334 and a second coil 335. The coil part 333 may be connected in parallel with a capacitor 336. One end of the capacitor 336 may be connected to one end of an inductor 337. The other end of the inductor 337 may be connected to one end of a capacitor 339. The other end of the capacitor 339 may be connected to one end of a capacitor 338 and to a ground 340. The capacitors 338 and 339 may be connected to a rectifier including at least one diode 341, 342, 343, and 344.

As shown in FIG. 3A to 3D, the electronic devices according to comparative examples may include multiple passive elements. In contrast, a wireless power receiver and wireless power transmitter according to various embodiments of the present disclosure may reduce EMI without adding a passive element. Hereinafter, a wireless power receiver and a wireless power transmitter each having a structure in which a ground is divided into multiple layers without a passive element added to reduce EMI will be described.

Figure 4:
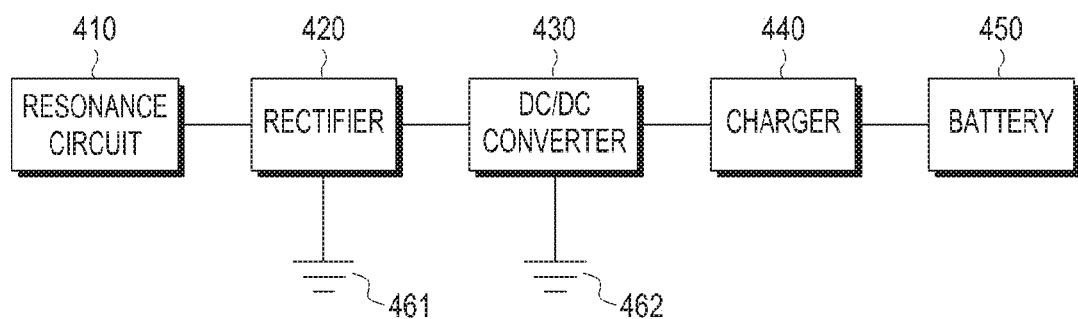
FIG. 4 is a block diagram illustrating a wireless power receiver according to various embodiments of the present disclosure.

FIG. 4 is a block diagram illustrating a wireless power receiver according to various embodiments of the present disclosure.

As shown in FIG. 4, a wireless power receiver may include a resonance circuit 410, a rectifier 420, a DC/DC converter 430, a charger 440, and a battery 450.

The resonance circuit 410 may receive an electromagnetic wave emitted from the wireless power transmitter and output the electromagnetic wave to the rectifier 420. The resonance circuit 410 may include at least one coil and at least one capacitor. The resonance circuit 410 may be designed to have a resonance frequency of an electromagnetic wave emitted by the wireless power transmitter. For example, when a wireless power transmitter and a wireless power receiver meet the A4WP standard, the resonance circuit 410 may be designed to have a resonance frequency of 6.78 MHz. The resonance circuit 410 may receive a power in an alternating current waveform, i.e., an electromagnetic wave, and output the power in the alternating current waveform by the received electromagnetic wave to the rectifier 420. Meanwhile, according to various embodiments of the present disclosure, a wireless power receiver may wirelessly receive power in the induction scheme as well. In this case, the wireless power receiver may include a coil. Consequently, the resonance circuit 410 or the coil may be referred to a power reception circuit.

The rectifier 420 may rectify input the power in the alternating current waveform into a power in a direct current waveform. The rectifier 420 may be implemented in the form of, for example, a bridge diode. However, the present disclosure is not limited to a particular implementation example. The DC/DC converter 430 may convert the rectified power into a predetermined gain. For example, the DC/DC converter 430 may convert the rectified power in such a manner that a voltage of an output terminal becomes a predetermined voltage. Meanwhile, a minimum value and a maximum value of voltage which can be applied to a front end of the DC/DC converter 430 may be pre-configured.

According to various embodiments of the present disclosure, the DC/DC converter 430 may convert voltage V1 of input power into V2 on the basis of a pre-configured gain. V2 may be a pre-configured value.

The control unit (not shown) may include one or more of a central processing unit (CPU), an application processor (AP), a communication processor (CP), a graphic processor (GP), a multi-chip package (MCP), and an image processor (IP). Alternatively, the control unit (not shown) may be implemented as various forms, such as a field-programmable gate array (FPGA), a micro controlling unit (MCU), a mini computer, etc. The control unit (not shown), for example, may carry out operations or data processing relating to control and/or communication of at least one other element of the wireless power receiver.

The charger 440 may charge the battery 450. A voltage at the output terminal of the charger 440, that is, at the input terminal of the battery 450 may be different from a voltage at the output terminal of the DC/DC converter 430. The battery 450 may be charged by storing power supplied from the charger 440. The battery 450 is illustrated as if the battery 450 is included in the wireless power receiver 250, but it is merely provided as an example. The battery 450 may be implemented in a form attachable to or detachable from the wireless power receiver 250.

Meanwhile, the rectifier 420 may rectify alternating current waveform power to a direct current waveform. Accordingly, a ground 461 to which at least a part of the rectifier 420 is connected may receive alternating current waveform power. Meanwhile, since the DC/DC converter 430 processes rectified power, a ground 462 to which at least a part of the DC/DC converter 430 is connected may receive direct current waveform power. According to various embodiments of the present disclosure, the ground 461 configured to receive alternating current waveform power may be referred to an alternating current ground, and the ground 462 configured to receive direct current waveform power may be referred to a direct current ground. According to various embodiments of the present disclosure, the ground 461 configured to receive alternating current waveform power and the ground 462 configured to receive direct current waveform power may be physically separated from each other. More specifically, the ground 462 configured to receive direct current waveform power may be disposed on one PCB and the ground 461 configured to receive alternating current waveform power may be disposed on another PCB. A PCB on which the ground 462 configured to receive direct current waveform power is disposed, and a PCB including the ground 461 configured to receive alternating current waveform power are implemented as physically different layers and are arranged to have a laminated structure.

The grounds 461 and 462 may include a conductor. For example, a conductor included in the ground 461 configured to receive alternating current waveform power may emit an electromagnetic wave again by using alternating current waveform power. According to comparative examples to be compared with the present disclosure, the rectifier 420 and the DC/DC converter 430 may be connected to one ground. In this case, as the ground receives alternating current waveform power, the ground may emit an electromagnetic wave again. The re-emitted electromagnetic wave may affect functions of the DC/DC converter 430 and other hardware directly or indirectly connected to the DC/DC converter 430. The wireless power receiver according to various embodiments of the present disclosure, as the ground 461 configured to receive alternating current waveform power and the ground 462 configured to receive direct current waveform power are physically separated from each other, may minimize an influence of an electromagnetic wave introduced into another hardware from the ground 461 configured to receive alternating current waveform power. Particularly, as hereinafter described in more detail, the wireless power receiver according to various embodiments of the present disclosure, as the ground 462 configured to receive direct current waveform power is disposed between the ground 461 configured to receive alternating current waveform power and a PCB on which hardware is disposed, may more inhibit an influence of an electromagnetic wave introduced into another hardware from the ground 461 configured to receive alternating current waveform power. According to another embodiment of the present disclosure, a layer including the ground 461 configured to receive alternating current waveform power may be disposed to be surrounded by a plurality of layers each including the ground 462 configured to receive direct current waveform power. Accordingly, an influence of an electromagnetic wave introduced into another hardware from the ground 461 configured to receive alternating current waveform power may be more inhibited. Meanwhile, an embodiment in FIG. 4 illustrates as if the ground 461 configured to receive alternating current waveform power is connected to the rectifier 420, and the ground 462 configured to receive direct current waveform power is connected to the DC/DC converter 430. However, it is merely provided as an example. A location of the ground 461 configured to receive alternating current waveform power is not limited as long as the ground 461 is located anywhere on a conducting wire through which a current in an alternating current waveform flows in the wireless power receiver. A location of the ground 462 configured to receive direct current waveform power is not limited as long as the ground 462 is located anywhere on a conducting wire through which a current in a direct current waveform flows in the wireless power receiver.

Figure 5:
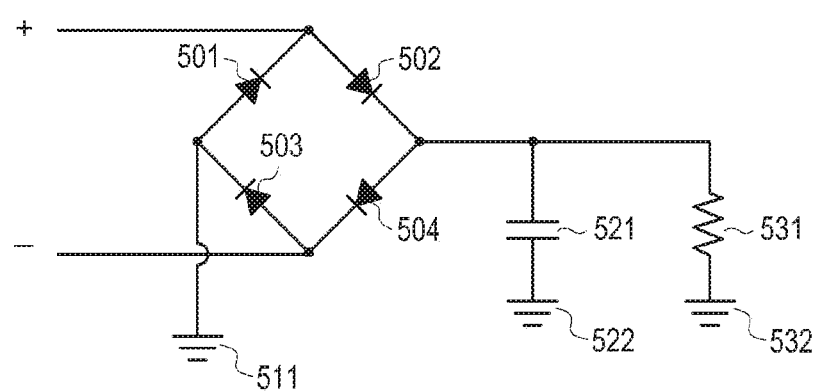
FIG. 5 is a circuit diagram illustrating a part of a wireless power receiver according to various embodiments of the present disclosure.

FIG. 5 is a circuit diagram illustrating a part of a wireless power receiver according to various embodiments of the present disclosure.

As shown in FIG. 5, a wireless power receiver according to various embodiments of the present disclosure may include a rectifier including at least one diode 501, 502, 503, and 504. An output terminal of a first diode 501 may be connected to an input terminal of a second diode 502. Here, a point at which an output is made in a forward direction of the diode may be referred to an output terminal. The output terminal of the second diode 502 may be connected to the input terminal of a forth diode 504. The input terminal of a third diode 503 may be connected to the output terminal of the forth diode 504, and the output terminal of the third diode 503 may be connected to the input terminal of the first diode 501. Meanwhile, differential signals may be applied to a first line (+) and a second line (−), respectively. Here, the differential signal may have two signals. The two signals may be inverted signals having a phase difference of 180 degrees. Meanwhile, the input terminal of the first diode 501 and the output terminal of the third diode 503 may be connected to an alternating current ground 511. At least a part of the rectifier may process alternating current waveform power, and an alternating current ground 511 may receive the alternating current waveform power. One end of a capacitor 521 may be connected to the output terminal of the second diode 502 and the input terminal of the forth diode 504. An alternating current ground 522 may be connected to the other end of the capacitor 521. According to various embodiments of the present disclosure, the alternating current ground 511 and the alternating current ground 522 may be implemented to include the same conductor or to include different conductors, respectively.

Meanwhile, one end of a resister 531 may be connected to one end of the capacitor 521. Here, rectified power, that is, direct current waveform power may be applied to the resistor 531. A direct current ground 532 may be connected to the other end of the resistor 531. The direct current ground 532 may receive rectified direct current waveform power.

According to various embodiments of the present disclosure, the grounds 511 and 522 configured to receive alternating current waveform power and the ground 532 configured to receive direct current waveform power may be physically separated from each other. More specifically, the grounds 511 and 522 configured to receive alternating current waveform power may be arranged on one PCB and the ground 532 configured to receive direct current waveform power may be disposed on another PCB. A PCB on which the grounds 511 and 522 configured to receive alternating current waveform power are arranged, and a PCB including the ground 532 configured to receive direct current waveform power are implemented as physically different layers and are arranged to have a laminated structure.

Figure 6:
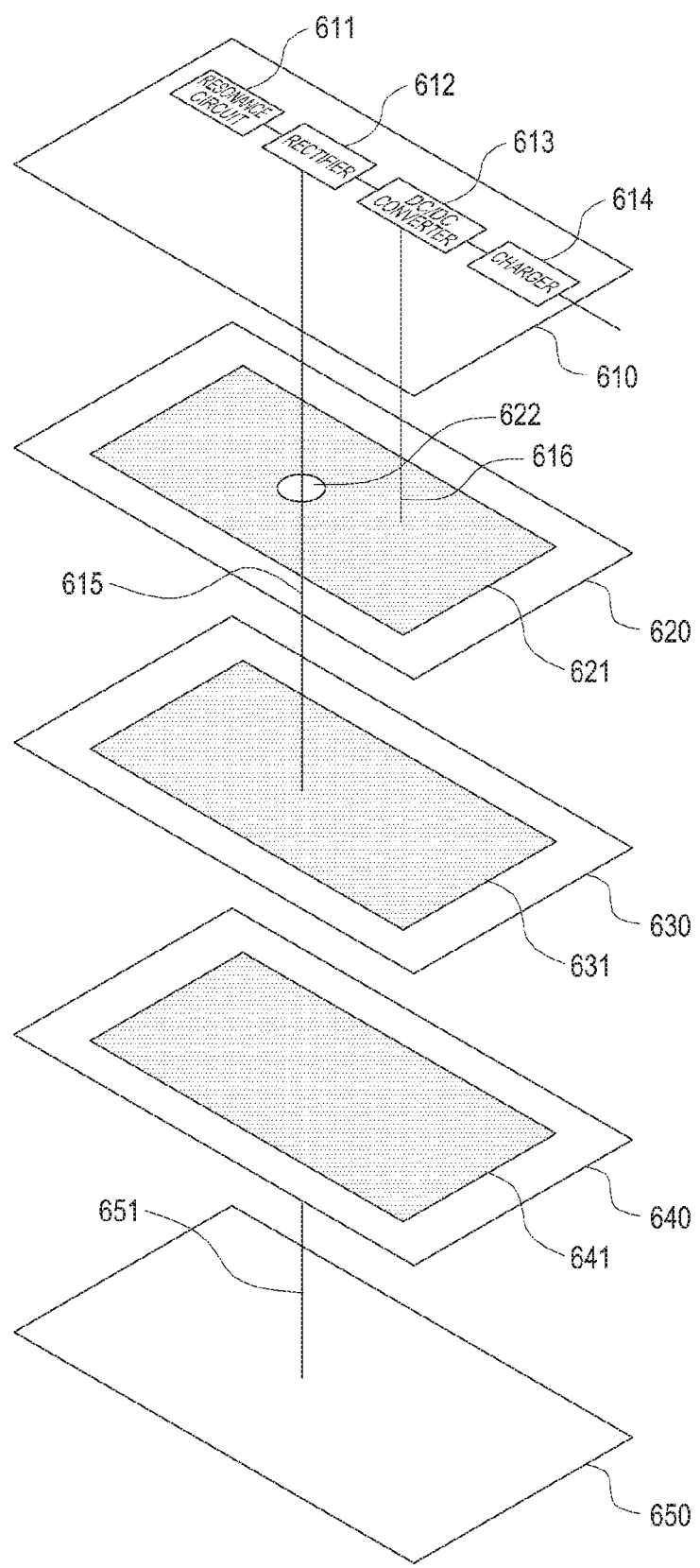
FIG. 6 illustrates a concept describing a multilayer structure of a wireless power receiver according to various embodiments of the present disclosure.

FIG. 6 illustrates a concept describing a multilayer structure of a wireless power receiver according to various embodiments of the present disclosure. A wireless power receiver according to various embodiments of the present disclosure may include a first PCB layer 610, a second PCB layer 620, a third PCB layer 630, a fourth PCB layer 640, and a fifth PCB layer 650. The first PCB layer 610 may be disposed over the second PCB layer 620, the second PCB layer 620 is disposed over the third PCB layer 630, the third PCB layer 630 may be disposed over the fourth PCB layer 640, and the fourth PCB layer 640 may be disposed over the fifth PCB layer 650. As described above, the structure in which a plurality of PCB layers are vertically arranged (on one another) may be named a multilayer structure.

The first PCB layer 610 may include a resonance circuit 611, a rectifier 612, a DC/DC converter 613, and a charger 614. An embodiment in FIG. 6 illustrates as if the resonance circuit 611, the rectifier 612, the DC/DC converter 613, and the charger 614 are included in the first PCB layer 610. However, it is merely provided as an example. According to various embodiments of the present disclosure, at least a part of the resonance circuit 611, the rectifier 612, the DC/DC converter 613, and the charger 614 may be disposed on the first PCB layer 610. Further, it is illustrated as if the resonance circuit 611, the rectifier 612, the DC/DC converter 613, and the charger 614 are implemented as different hardware, but it is also provided as an example. According to various embodiments of the present disclosure, at least two selected from the resonance circuit 611, the rectifier 612, the DC/DC converter 613, and the charger 614 may be implemented as one piece of hardware as well. Further, hardware implemented by the resonance circuit 611, the rectifier 612, the DC/DC converter 613, and the charger 614 may be implemented in various forms, such as an IC, an analog element, or the like, and one skilled in the art may easily understand that there is no limitation to the form of implementation.

The second PCB layer 620 according to various embodiments of the present disclosure may include a direct current ground 621 configured to receive direct current waveform power. According to various embodiments of the present disclosure, the direct current ground 621 may include a conductor. At least a part of the DC/DC converter 613 may be connected to the direct current ground 621, and the direct current ground 621 may thus receive direct current waveform power processed by the DC/DC converter 613. Meanwhile, as described above, according to various embodiments of the present disclosure, any hardware configured to process direct current waveform power may be connected to the direct current ground 621, and one skilled in the art may easily understand that hardware connected to the direct current ground 621 is not limited to the DC/DC converter 613. More specifically, the charger 614 may also process direct current waveform power, and a part required to be grounded, of the charger 614 may be connected to the direct current ground 621 as well. Accordingly, even though FIG. 6 illustrates a single conducting wire 616 that connects the first PCB layer 610 to the direct current ground 621, there may be a plurality of wires 616 connecting hardware to the direct current ground 621 depending on the number of pieces of the hardware to be grounded.

The third PCB layer 630 according to various embodiments of the present disclosure may include an alternating current ground 631 configured to receive alternating current waveform power. According to various embodiments of the present disclosure, the alternating current ground 631 may include a conductor. At least a part of the rectifier 612 may be connected to the alternating current ground 631, and the alternating current ground 631 may thus receive alternating current waveform power processed by the rectifier 612. Meanwhile, as described above, according to various embodiments of the present disclosure, any hardware configured to process alternating current waveform power may be connected to the alternating current ground 631, and one skilled in the art may easily understand that hardware connected to the alternating current ground 631 is not limited to the rectifier 612. More specifically, the resonance circuit 611 may also process alternating current waveform power, and a part required to be grounded, of the resonance circuit 611 may be connected to the alternating current ground 631 as well. Accordingly, even though FIG. 6 illustrates a single conducting wire 615 that connects the first PCB layer 610 to the alternating current ground 631, there may be a plurality of conducting wires 615 connecting hardware to the alternating current ground 631 depending on the number of pieces of the hardware to be grounded.

Meanwhile, according to various embodiments of the present disclosure, the conducting wire 615 connecting the first PCB layer 610 to the alternating current ground 631 may connect the first PCB layer 610 and the alternating current ground 631 through an opening 622 formed through the second PCB layer 620. Meanwhile, formation of the opening 622 through the second PCB layer 620 in order to connect the first PCB layer 610 and the alternating current ground 631 is merely provided as an example. The conducting wire 615 may connect the first PCB layer 610 and the alternating current ground 631 in various forms, such as bypassing the second PCB layer 620, etc.

As a result of the above description, an influence of an electromagnetic wave generated from the alternating current ground 631 over the first PCB layer 610 may be minimized. For example, the direct current ground 621 may block an electromagnetic wave generated from the alternating current ground 631, and this will be described in more detail, referring to FIG. 7.

Meanwhile, according to various embodiments of the present disclosure, the wireless power receiver may include the forth PCB layer 640 disposed between the third PCB layer 630 and the fifth PCB layer 650. For example, other hardware, such as a processor or a memory, may be arranged on the fifth PCB layer 650. An electromagnetic wave generated from the alternating current ground 631 may also influence hardware arranged on the fifth PCB layer 650. For this reason, the wireless power receiver according to various embodiments of the present disclosure may include a direct current ground 641 to block an electromagnetic wave introduced into the fifth PCB layer 650 from the alternating current ground 631. Accordingly, an electromagnetic wave generated from the alternating current ground 631 may be blocked and EMI may thus be reduced. Meanwhile, hardware required to be DC-grounded on the fifth PCB layer 650 may be grounded through a conducting wire 651 at the direct current ground 641. Although it is not illustrated, hardware required to be AC-grounded on the fifth PCB layer 650 may be connected to the alternating current ground 631 or connected to another alternating current ground (not shown).

As described above, the wireless power receiver according to various embodiments of the present disclosure may include grounds in a multilayer structure, and may include, for example, a structure in which a plurality of direct current grounds surround an alternating current ground. As a result of the above description, an influence of an electromagnetic wave generated from the alternating current ground over other hardware may be diminished and EMI may thus be reduced.

Figure 7:
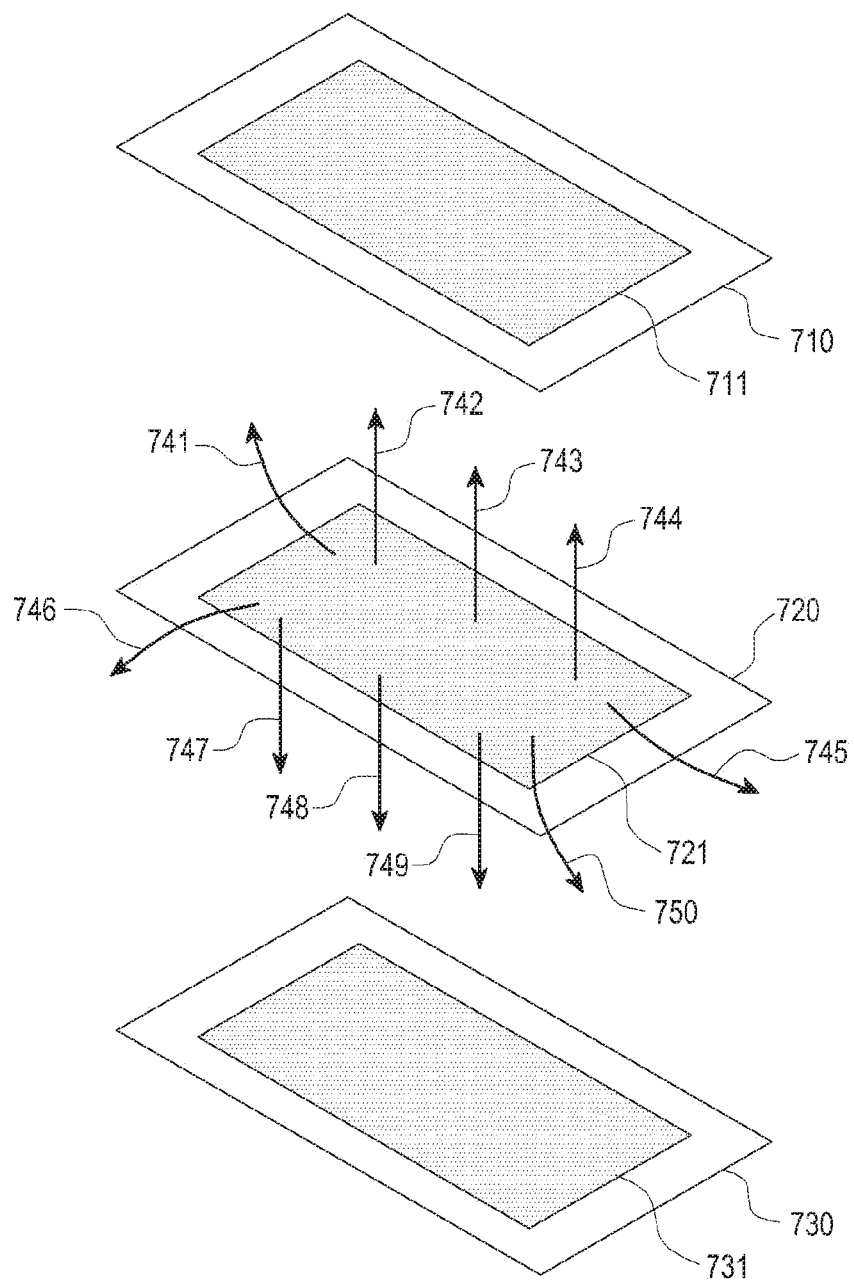
FIG. 7 illustrates a concept describing blocking an electromagnetic wave of an alternating current ground according to various embodiments of the present disclosure.

FIG. 7 illustrates a concept describing blocking an electromagnetic wave from an alternating current ground according to various embodiments of the present disclosure.

As illustrated in FIG. 7, the wireless power receiver according to various embodiments of the present disclosure may include a first PCB layer 710, a second PCB layer 720, and a third PCB layer 730. The first PCB layer 710 may be disposed over the second PCB layer 720, and the second PCB layer 720 may be disposed over the third PCB layer 730. Meanwhile, although it is not illustrated, at least one piece of hardware may be disposed over the first PCB layer 710, and at least one piece of hardware may be disposed on the lower side of the third PCB layer 730.

The first PCB layer 710 may include a direct current ground 711, and the third PCB layer 730 may include a direct current ground 731. Although it is not illustrated, the at least one piece of hardware disposed over the first PCB layer 710 may be connected to the direct current ground 711, and the at least one piece of hardware disposed on the lower side of the third PCB layer 730 may be connected to the direct current ground 731. For example, a point required to be grounded, among hardware configured to process direct current waveform power may be connected to the direct current ground 711 or 731 through a conducting wire. According to various embodiments of the present disclosure, even no hardware may be connected to the direct current ground 711 or 731. That is, the direct current ground 711 or 731 may be disposed to block an electromagnetic wave.

The second PCB layer 720 may include an alternating current ground 721. Although it is not illustrated, at least one selected from the at least one piece of hardware disposed over the first PCB layer 710 and the at least one piece of hardware disposed on the lower side of the third PCB layer 730 may be connected to the alternating current ground 721. For example, a point required to be grounded, among hardware configured to process alternating current waveform power may be connected to the alternating current ground 721 through a conducting wire. The alternating current ground 721 may receive alternating current waveform power and thus emit electromagnetic waves 741 to 750.

As illustrated in FIG. 7, the direct current ground 711 may prevent electromagnetic waves 741 to 745, which are emitted upward from the alternating current ground 721, from being introduced into the at least one piece of hardware disposed over the first PCB layer 710. Further, the direct current ground 731 may prevent electromagnetic waves 746 to 750, which are emitted downward from the alternating current ground 721, from being introduced into the at least one piece of hardware disposed on the lower side of the third PCB layer 730. Accordingly, interference by an electromagnetic wave may be reduced, and entire EMI of the wireless power receiver may thus be reduced.

Figure 8:
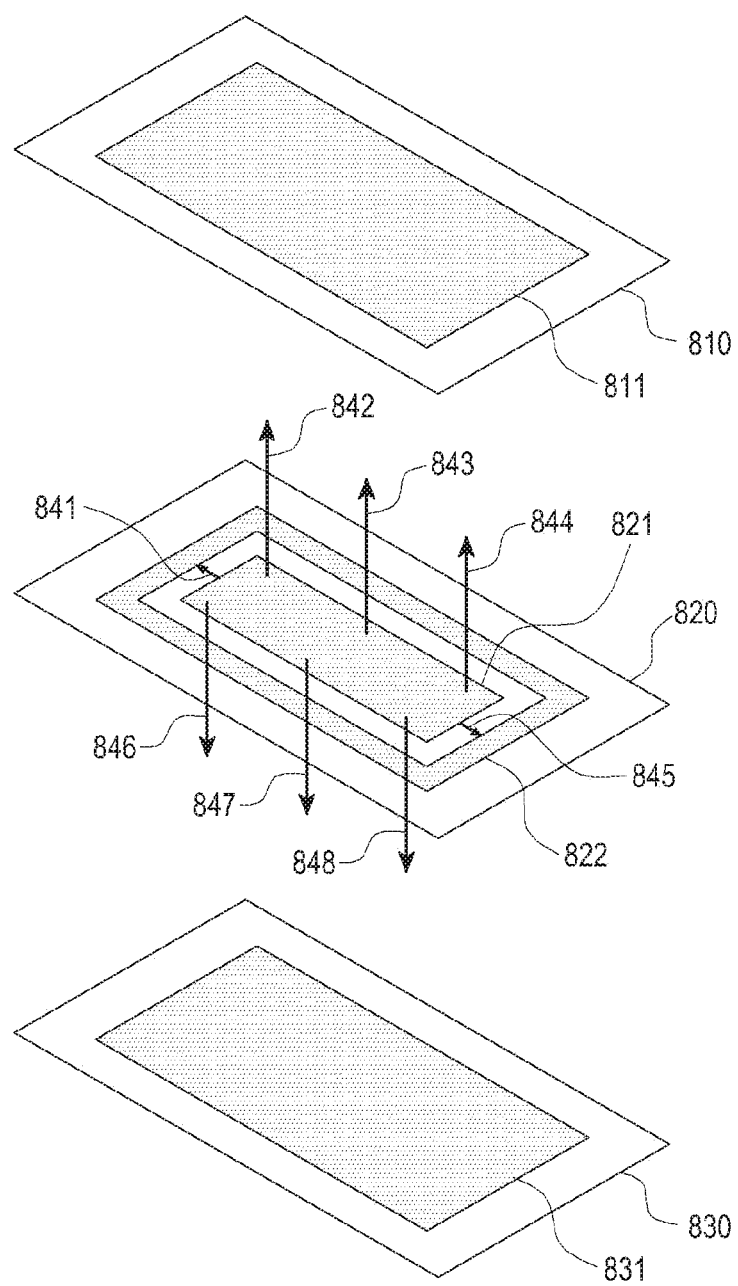
FIG. 8 illustrates a concept describing blocking an electromagnetic wave of an alternating current ground according to various embodiments of the present disclosure.

FIG. 8 illustrates a concept describing blocking an electromagnetic wave from an alternating current ground according to various embodiments of the present disclosure.

As illustrated in FIG. 8, the wireless power receiver according to various embodiments of the present disclosure may include a first PCB layer 810, a second PCB layer 820, and a third PCB layer 830. The first PCB layer 810 may be disposed over the second PCB layer 820, and the second PCB layer 820 may be disposed over the third PCB layer 830. Meanwhile, although it is not illustrated, at least one piece of hardware may be disposed over the first PCB layer 810, and at least one piece of hardware may be disposed on the lower side of the third PCB layer 830.

The first PCB layer 810 may include a direct current ground 811, and the third PCB layer 830 may include a direct current ground 831. Although it is not illustrated, the at least one piece of hardware disposed over the first PCB layer 810 may be connected to the direct current ground 811, and the at least one piece of hardware disposed on the lower side of the third PCB layer 830 may be connected to the direct current ground 831. For example, a point required to be grounded, among hardware configured to process direct current waveform power may be connected to the direct current ground 811 or 831 through a conducting wire. According to various embodiments of the present disclosure, even no hardware may be connected to the direct current ground 811 or 831. That is, the direct current ground 811 or 831 may be disposed to block an electromagnetic wave.

The second PCB layer 820 may include an alternating current ground 821. Although it is not illustrated, at least one selected from the at least one piece of hardware disposed over the first PCB layer 810 and the at least one piece of hardware disposed on the lower side of the third PCB layer 830 may be connected to the alternating current ground 821. For example, a point required to be grounded, among hardware configured to process alternating current waveform power may be connected to the alternating current ground 821 through a conducting wire. Further, the second PCB layer 820 may include a ground 822 surrounding the alternating current ground 821. More specifically, the ground 822 may be disposed on the second PCB layer 820 and may be implemented to have a closed loop shape surrounding the alternating current ground 821. The ground 822 may be physically spaced apart from the alternating current ground 821.

The ground 822 may be used to ground other hardware. According to another embodiment, even no hardware may be connected to the ground 822, and the ground 822 may be used only to block an electromagnetic wave. The ground 822 may include a conductor. The alternating current ground 821 may receive alternating current waveform power and thus emit electromagnetic waves 841 to 848.

As described above, the direct current ground 811 may prevent electromagnetic waves 842 to 844, which are emitted upward from the alternating current ground 821, from being introduced into the at least one piece of hardware disposed over the first PCB layer 810. Further, the direct current ground 831 may prevent electromagnetic waves 846 to 848, which are emitted downward from the alternating current ground 821, from being introduced into the at least one piece of hardware disposed on the lower side of the third PCB layer 830. Additionally, the ground 822 disposed to surround the alternating current ground 821 may prevent electromagnetic waves 841 and 845, which are emitted laterally from the alternating current ground 821, from being introduced into other hardware. Accordingly, interference by an electromagnetic wave may be reduced, and entire EMI of the wireless power receiver may thus be reduced. Meanwhile, implementation of the ground 822 having a closed loop shape is merely provided as an example. One skilled in the art may easily understand that a shape of the ground 822 has no limitation as long as the ground 822 may block electromagnetic waves 841 and 845 emitted laterally from the alternating current ground 821 on the second PCB layer 820. Further, although the ground 822 is illustrated as a single conductor, it is also provided as an example and, according to various embodiments of the present disclosure, the ground 822 may be implemented by a plurality of conductors disposed adjacent to the alternating current ground 821, with a spatial interval.

FIGS. 9A to 9D illustrate a concept describing patterns of an alternating current ground according to various embodiments of the present disclosure.

Figure 9A:
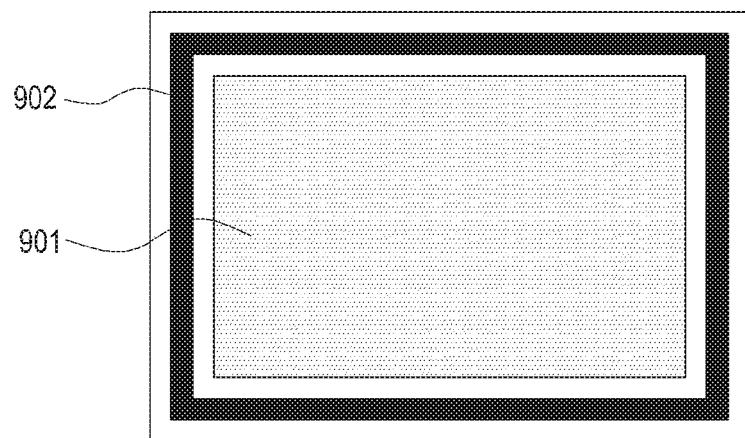
FIGS. 9A to 9D illustrate a concept describing patterns of an alternating current ground according to various embodiments of the present disclosure.

Referring to FIG. 9A, an alternating current ground 901 may be surrounded by an additional ground 902. The additional ground 902 may be implemented to have a closed loop shape and thus block an electromagnetic wave emitted laterally from the alternating current ground 901.

Figure 9B:
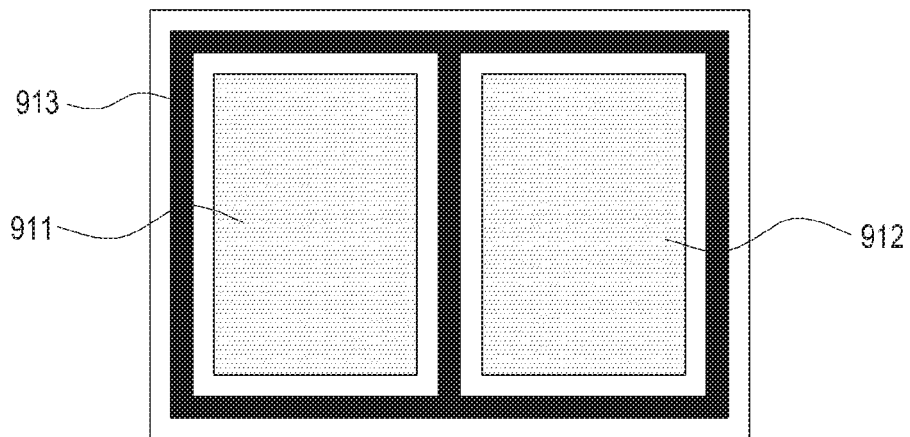
Figure 10:
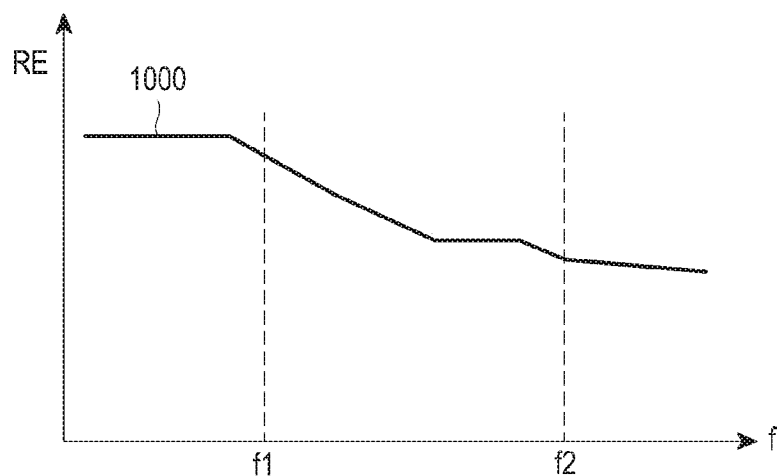
FIG. 10 is a graph illustrating radiation emission (RE) levels for each frequency according to various embodiments of the present disclosure.

Referring to FIG. 9B, the wireless power receiver may include a first alternating current ground 911 and a second alternating current ground 912. Each of the first alternating current ground 911 and the second alternating current ground 912 may be connected to at least part of hardware configured to process alternating current waveform power and may receive the alternating current waveform power. FIG. 10 is a graph illustrating radiation emission (RE) levels 1000 for each frequency according to various embodiments of the present disclosure. As illustrated in FIG. 10, a radiation emission level at a second frequency f2 may be lower than that of a first frequency f1. Accordingly, with a lower frequency, EMI by the alternating current ground may be reduced. Meanwhile, an area of the alternating current ground and a frequency of an electromagnetic wave emitted therefrom may be in inverse proportion to each other. That is, the smaller area the alternating current ground has, the higher frequency the electromagnetic wave may have. For this reason, as in FIG. 9B, the wireless power receiver may include a plurality of alternating current grounds 911 and 912, each of which has a relatively small area. Particularly, the total area of the plurality of alternating current grounds 911 and 912 may be substantially the same as that of the single alternating current ground 901, and a signal may be stabilized as well. Here, the area of the alternating current ground 901 may be an area configured to make signal stability exceed a pre-configured threshold value.

Further, as an electromagnetic wave emitted from the alternating current grounds 911 and 912 each having a relatively small area has a relatively high frequency, the electromagnetic wave may have a relatively low diffraction degree. Due to having a relatively low diffraction degree, an electromagnetic wave emitted laterally from the alternating current grounds 911 and 912 has improved straightness, and most electromagnetic waves emitted laterally may be blocked by a ground 913.

Figure 9C:
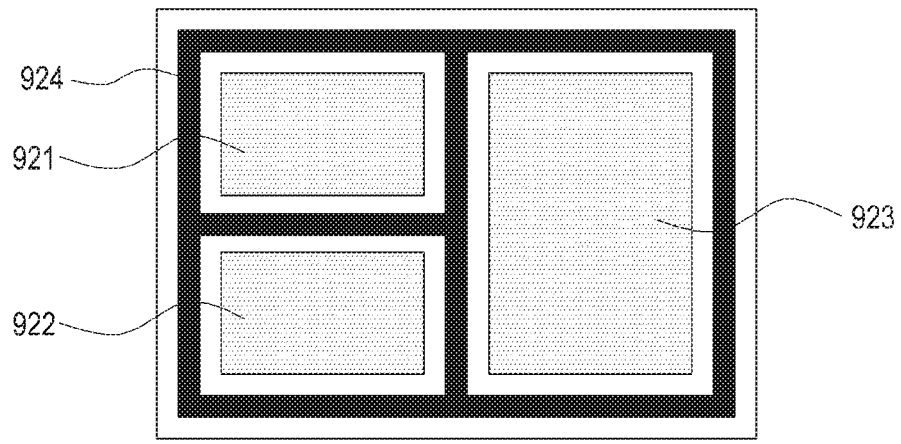
Figure 9D:
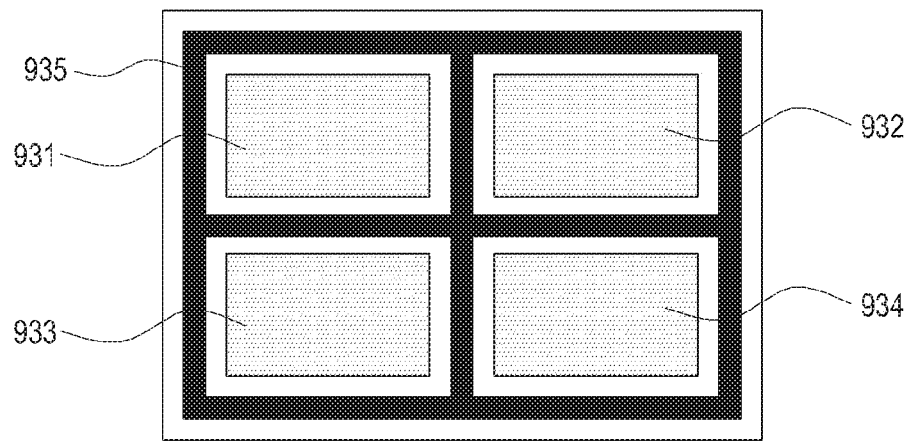

The wireless power receiver according to various embodiments of the present disclosure may include an alternating current ground having a relatively small area, and thus include alternating current grounds in various patterns as in FIGS. 9A to 9D. As illustrated in FIG. 9C, the wireless power receiver may include a first to a third alternating current ground 921 to 923 and a ground 924 disposed to surround the first to the third alternating current ground 921 to 923. As illustrated in FIG. 9D, the wireless power receiver may include a first to a fourth alternating current ground 931 to 934 and a ground 935 disposed to surround the first to the fourth alternating current ground 931 to 934. As illustrated in FIGS. 9B to 9D, each of the alternating current grounds of the wireless power receiver may have a relatively smaller area, compared with the alternating current ground 901 in FIG. 9A. However, the total area of the alternating current grounds in each of FIGS. 9B to 9D may be substantially the same as that of the alternating current ground 901 in FIG. 9A, and signal stability may thus be secured.

Figure 11:
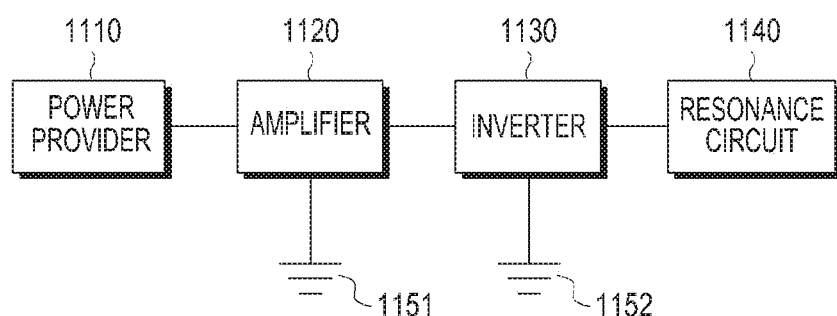
FIG. 11 is a block diagram of a wireless power transmitter according to various embodiments of the present disclosure.

FIG. 11 is a block diagram of a wireless power transmitter according to various embodiments of the present disclosure. As illustrated in FIG. 11, the wireless power transmitter may include a power provider 1110, an amplifier 1120, an inverter 1130, and a resonance circuit 1140.

The power provider 1110 may include a direct current power source. The direct current power source may be implemented by an inner battery or may be implemented by an interface configured to receive power input from the outside. The power provider 1110 may output direct current waveform power to the amplifier 1120.

The amplifier 1120 may amplify the input direct current waveform power received from the power provider 1110 with a pre-configured gain. The amplifier 1120 may output the amplified direct current waveform power to the inverter 1130. The inverter 1130 may invert direct current waveform power to alternating current waveform to output the power having the inverted waveform. The resonance circuit 1140 may emit an electromagnetic wave for charging a wireless power receiver. The resonance circuit 1140 may include at least one coil and at least one capacitor. The resonance circuit 1140 may be designed to have a resonance frequency of an electromagnetic wave emitted by the wireless power transmitter. For example, when a wireless power transmitter and a wireless power receiver meet the A4WP standard, the resonance circuit 1140 may be designed to have a resonance frequency of 6.78 MHz. Meanwhile, according to various embodiments of the present disclosure, a wireless power transmitter may wirelessly transmit power in the induction scheme as well. In this case, a wireless power transmitter may include a coil. Consequently, the resonance circuit 1140 or the coil may be referred to a power transmission circuit.

At least part of the amplifier 1120 may be connected to a direct current ground 1151, and at least part of the inverter 1130 may be connected to an alternating current ground 1152. The inverter 1130 may rectify direct current waveform power to an alternating current waveform. Accordingly, the alternating current ground 1152 to which the at least part of the inverter 1130 is connected may receive alternating current waveform power. Meanwhile, since the amplifier 1120 processes direct current waveform power, the direct current ground 1151 to which the at least part of the amplifier 1120 is connected may receive direct current waveform power.

According to various embodiments of the present disclosure, the direct current ground 1151 and the alternating current ground 1152 may be separated from each other. More specifically, the direct current ground 1151 may be disposed on one PCB and the alternating current ground 1152 may be disposed on another PCB. A PCB on which the direct current ground 1151, and a PCB including the alternating current ground 1152 are implemented as physically different layers and are arranged to have a laminated structure. The ground 1151, 1152 may include a conductor. As a result of the above description, as the direct current ground 1151 and the alternating current ground 1152 are physically separated from each other, an influence of an electromagnetic wave introduced into other hardware from the alternating current ground 1152 may be minimized. Meanwhile, an embodiment in FIG. 11 is illustrated as if the alternating current ground 1152 is connected to the inverter 1130, and the direct current ground 1151 is connected to the amplifier 1120. However, it is merely provided as an example. A location of the alternating current ground 1152 is not limited as long as the alternating current ground 1152 is located anywhere on a conducting wire through which a current in an alternating current waveform flows in the wireless power transmitter. A location of the direct current ground 1151 is not limited as long as the direct current ground 1151 is located anywhere on a conducting wire through which a current in a direct current waveform flows in the wireless power transmitter.

Figure 12:
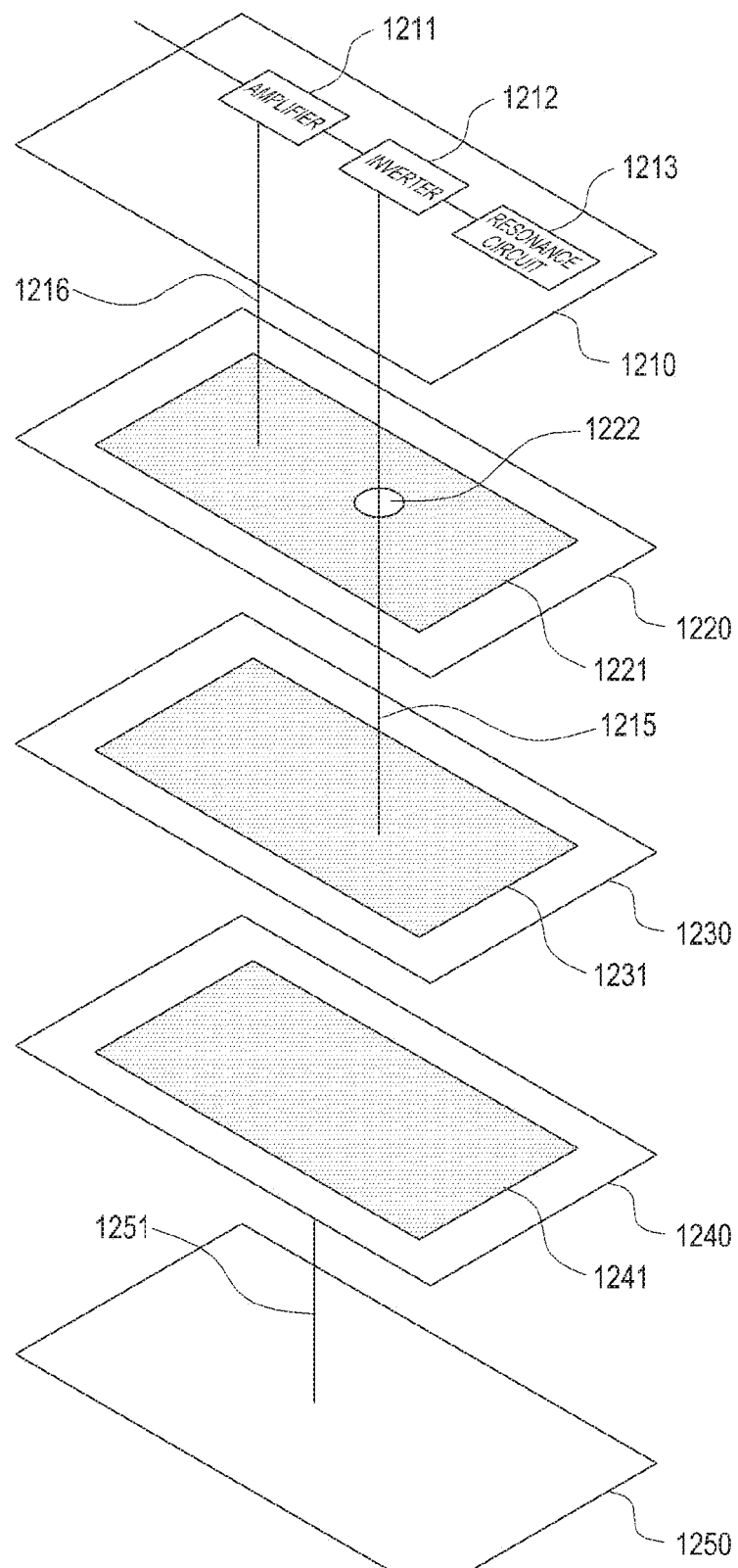
FIG. 12 illustrates a concept describing a multilayer structure of a wireless power transmitter according to various embodiments of the present disclosure.

FIG. 12 illustrates a concept describing a multilayer structure of a wireless power transmitter according to various embodiments of the present disclosure. A wireless power transmitter according to various embodiments of the present disclosure may include a first PCB layer 1210, a second PCB layer 1220, a third PCB layer 1230, a fourth PCB layer 1240, and a fifth PCB layer 1250. The first PCB layer 1210 may be disposed over the second PCB layer 1220, the second PCB layer 1220 is disposed over the third PCB layer 1230, the third PCB layer 1230 may be disposed over the fourth PCB layer 1240, and the fourth PCB layer 1240 may be disposed over the fifth PCB layer 1250. As described above, the structure in which a plurality of PCB layers are vertically arranged (on one another) may be named a multilayer structure.

The first PCB layer 1210 may include an amplifier 1211, an inverter 1212, and a resonance circuit 1213. An embodiment in FIG. 12 illustrates as if the amplifier 1211, the inverter 1212, and the resonance circuit 1213 are included in the first PCB layer 1210. However, it is merely provided as an example. According to various embodiments of the present disclosure, at least a part of the amplifier 1211, the inverter 1212, and the resonance circuit 1213 may be disposed on the first PCB layer 1210. Further, it illustrates as if the amplifier 1211, the inverter 1212, and the resonance circuit 1213 are implemented as different hardware, but it is also provided as an example. According to various embodiments of the present disclosure, at least two selected from the amplifier 1211, the inverter 1212, and the resonance circuit 1213 may be implemented as one piece of hardware as well. Further, hardware implemented by the amplifier 1211, the inverter 1212, and the resonance circuit 1213 may be implemented in various forms, such as an IC, an analog element, or the like, and one skilled in the art may easily understand that there is no limitation to the form of implementation.

The second PCB layer 1220 according to various embodiments of the present disclosure may include a direct current ground 1221 configured to receive direct current waveform power. According to various embodiments of the present disclosure, the direct current ground 1221 may include a conductor. At least a part of the amplifier 1211 may be connected to the direct current ground 1221, and the direct current ground 1221 may thus receive direct current waveform power processed by the amplifier 1211. Meanwhile, as described above, according to various embodiments of the present disclosure, any hardware configured to process direct current waveform power may be connected to the direct current ground 1221, and one skilled in the art may easily understand that hardware connected to the direct current ground 1221 is not limited to the amplifier 1211.

Accordingly, even though FIG. 12 illustrates a single conducting wire 1216 that connects the first PCB layer 1210 to the direct current ground 1221, there may be a plurality of wires 1216 connecting hardware to the direct current ground 1221 depending on the number of pieces of the hardware to be grounded.

The third PCB layer 1230 according to various embodiments of the present disclosure may include an alternating current ground 1231 configured to receive alternating current waveform power. According to various embodiments of the present disclosure, the alternating current ground 1231 may include a conductor. At least a part of the inverter 1212 may be connected to the alternating current ground 1231, and the alternating current ground 1231 may thus receive alternating current waveform power processed by the inverter 1212. Meanwhile, as described above, according to various embodiments of the present disclosure, any hardware configured to process alternating current waveform power may be connected to the alternating current ground 1231, and one skilled in the art may easily understand that hardware connected to the alternating current ground 1231 is not limited to the inverter 1212. More specifically, the resonance circuit 1213 may also process alternating current waveform power, and a part required to be grounded, of the resonance circuit 1213 may be connected to the alternating current ground 1231 as well. Accordingly, even though FIG. 12 illustrates a single conducting wire 1215 that connects the first PCB layer 1210 to the alternating current ground 1231, there may be a plurality of conducting wires 1215 connecting hardware to the alternating current ground 1231 depending on the number of pieces of the hardware to be grounded.

Meanwhile, according to various embodiments of the present disclosure, the conducting wire 1215 connecting the first PCB layer 1210 to the alternating current ground 1231 may connect the first PCB layer 1210 and the alternating current ground 1231 through an opening 1222 formed through the second PCB layer 1220. Meanwhile, formation of the opening 1222 through the second PCB layer 1220 in order to connect the first PCB layer 1210 and the alternating current ground 1231 is merely provided as an example. The conducting wire 1215 may connect the first PCB layer 1210 and the alternating current ground 1231 in various forms, such as bypassing the second PCB layer 1220, etc.

As a result of the above description, an influence of an electromagnetic wave generated from the alternating current ground 1231 over the first PCB layer 1210 may be minimized. For example, the direct current ground 1221 may block an electromagnetic wave generated from the alternating current ground 1231.

Meanwhile, according to various embodiments of the present disclosure, the wireless power transmitter may include the forth PCB layer 1240 disposed between the third PCB layer 1230 and the fifth PCB layer 1250. For example, other hardware, such as a processor or a memory, may be arranged on the fifth PCB layer 1250. An electromagnetic wave generated from the alternating current ground 1231 may also influence hardware arranged on the fifth PCB layer 1250. For this reason, the wireless power transmitter according to various embodiments of the present disclosure may include a direct current ground 1241 to block an electromagnetic wave introduced into the fifth PCB layer 1250 from the alternating current ground 1231. Accordingly, an electromagnetic wave generated from the alternating current ground 1231 may be blocked and EMI may thus be reduced. Meanwhile, hardware required to be DC-grounded, on the fifth PCB layer 1250 may be grounded through a conducting wire 1251 at the direct current ground 1241. Although it is not illustrated, hardware required to be AC-grounded, on the fifth PCB layer 1250 may be connected to the alternating current ground 1231 or connected to another alternating current ground (not shown).

As described above, the wireless power transmitter according to various embodiments of the present disclosure may include grounds in a multilayer structure, and may include, for example, a structure in which a plurality of direct current grounds surround an alternating current ground. As a result of the above description, an influence of an electromagnetic wave generated from the alternating current ground over other hardware may be diminished and EMI may thus be reduced.

Meanwhile, the alternating current ground 1231 of the wireless power transmitter may additionally include, on the third PCB layer 1230, a ground which is disposed adjacent to the alternating current ground 1231 or surrounds the alternating current ground 1231 as in the embodiment in FIG. 8. Alternatively, the alternating current ground 1231 of the wireless power transmitter may be configured to include a plurality of alternating current grounds each having a relatively small area as in FIGS. 9A to 9D. Further, as in FIGS. 9A to 9D, a plurality of alternating current grounds each having a relatively small area may have various patterns.

Figure 13:
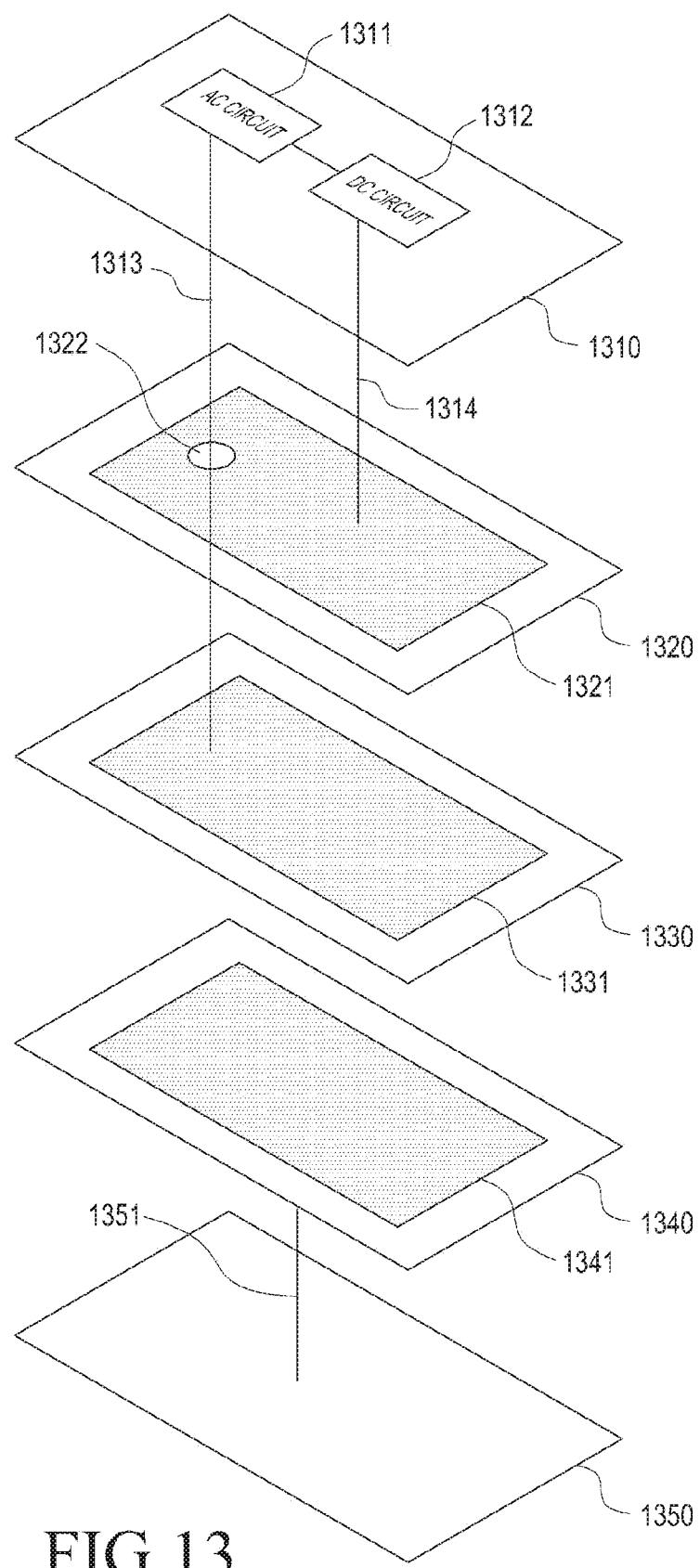
FIG. 13 illustrates a concept describing a multilayer structure of an electronic device according to various embodiments of the present disclosure.

FIG. 13 illustrates a concept describing a multilayer structure of an electronic device according to various embodiments of the present disclosure. An electronic device according to various embodiments of the present disclosure may include a first PCB layer 1310, a second PCB layer 1320, a third PCB layer 1330, a fourth PCB layer 1340, and a fifth PCB layer 1350. The first PCB layer 1310 may be disposed over the second PCB layer 1320, the second PCB layer 1320 is disposed over the third PCB layer 1330, the third PCB layer 1330 may be disposed over the fourth PCB layer 1340, and the fourth PCB layer 1340 may be disposed over the fifth PCB layer 1350. As described above, the structure in which a plurality of PCB layers are vertically arranged (on one another) may be named a multilayer structure.

The first PCB layer 1310 may include an AC circuit 1311, and a DC circuit 1312. The second PCB layer 1320 according to various embodiments of the present disclosure may include a direct current ground 1321 configured to receive direct current waveform power. According to various embodiments of the present disclosure, the direct current ground 1321 may include a conductor. At least a part of the DC circuit 1312 may be connected to the direct current ground 1321, and the direct current ground 1321 may thus receive direct current waveform power processed by the DC circuit 1312. Accordingly, even though FIG. 13 illustrates a single conducting wire 1314 that connects the first PCB layer 1310 to the direct current ground 1321, there may be a plurality of wires 1314 connecting hardware to the direct current ground 1321 depending on the number of pieces of the hardware to be grounded.

The third PCB layer 1330 according to various embodiments of the present disclosure may include an alternating current ground 1331 configured to receive alternating current waveform power. According to various embodiments of the present disclosure, the alternating current ground 1331 may include a conductor. The AC circuit 1311 may be connected to the alternating current ground 1331, and the alternating current ground 1331 may thus receive alternating current waveform power processed by the AC circuit 1311. Even though FIG. 13 illustrates a single conducting wire 1313 that connects the first PCB layer 1310 to the alternating current ground 1331, there may be a plurality of conducting wires 1313 connecting hardware to the alternating current ground 1331 depending on the number of pieces of the hardware to be grounded.

Meanwhile, according to various embodiments of the present disclosure, the conducting wire 1313 connecting the first PCB layer 1310 to the alternating current ground 1331 may connect the first PCB layer 1310 and the alternating current ground 1331 through an opening 1322 formed through the second PCB layer 1320. Meanwhile, formation of the opening 1322 through the second PCB layer 1320 in order to connect the first PCB layer 1310 and the alternating current ground 1331 is merely provided as an example. The conducting wire 1313 may connect the first PCB layer 1310 and the alternating current ground 1331 in various forms, such as bypassing the second PCB layer 1320, etc.

As a result of the above description, an influence of an electromagnetic wave generated from the alternating current ground 1331 over the first PCB layer 1310 may be minimized. For example, the direct current ground 1321 may block an electromagnetic wave generated from the alternating current ground 1331.

Meanwhile, according to various embodiments of the present disclosure, the electronic device may include the forth PCB layer 1340 disposed between the third PCB layer 1330 and the fifth PCB layer 1350. For example, other hardware, such as a processor or a memory, may be arranged on the fifth PCB layer 1350. An electromagnetic wave generated from the alternating current ground 1331 may also influence hardware arranged on the fifth PCB layer 1350. For this reason, the electronic device according to various embodiments of the present disclosure may include a direct current ground 1341 to block an electromagnetic wave introduced into the fifth PCB layer 1350 from the alternating current ground 1331. Accordingly, an electromagnetic wave generated from the alternating current ground 1331 may be blocked and EMI may thus be reduced. Meanwhile, hardware required to be DC-grounded, on the fifth PCB layer 1350 may be grounded through a conducting wire 1351 at the direct current ground 1341. Although it is not illustrated, hardware required to be AC-grounded, on the fifth PCB layer 1350 may be connected to the alternating current ground 1331 or connected to another alternating current ground (not shown).

As described above, the electronic device according to various embodiments of the present disclosure may include grounds in a multilayer structure, and may include, for example, a structure in which a plurality of direct current grounds surround an alternating current ground. As a result of the above description, an influence of an electromagnetic wave generated from the alternating current ground over other hardware may be diminished and EMI may thus be reduced.

Meanwhile, the alternating current ground 1331 of the electronic device may additionally include, on the third PCB layer 1330, a ground which is disposed adjacent to the alternating current ground 1331 or surrounds the alternating current ground 1331 as in the embodiment in FIG. 8. Alternatively, the alternating current ground 1331 of the electronic device may be configured to include a plurality of alternating current grounds each having a relatively small area as in FIGS. 9A to 9D. Further, as in FIGS. 9A to 9D, a plurality of alternating current grounds each having a relatively small area may have various patterns.

Each of the components of the electronic device according to the present disclosure may be implemented by one or more components and the name of the corresponding component may vary depending on a type of the electronic device. In various embodiments, the inspection apparatus may include at least one of the above-described elements. Some of the above-described elements may be omitted from the electronic device, or the inspection apparatus may further include additional elements. Further, some of the components of the electronic device according to the various embodiments of the present disclosure may be combined to form a single entity, and thus, may equivalently execute functions of the corresponding elements prior to the combination.

The term "module" as used herein may, for example, mean a unit including one of hardware, software, and firmware or a combination of two or more of them. The "module" may be interchangeably used with, for example, the term "unit", "logic", "logical block", "component", or "circuit". The "module" may be the smallest unit of an integrated component or a part thereof. The "module" may be the smallest unit that performs one or more functions or a part thereof. The "module" may be mechanically or electronically implemented. For example, the "module" according to the present disclosure may include at least one of an Application-Specific Integrated Circuit (ASIC) chip, a Field-Programmable Gate Arrays (FPGA), and a programmable-logic device for performing operations which has been known or are to be developed hereinafter.

According to various embodiments, at least some of the devices (for example, modules or functions thereof) or the method (for example, operations) according to the present disclosure may be implemented by a command stored in a computer-readable storage medium in a programming module form. When the command is executed by one or more processors, the one or more processors may perform a function corresponding to the command. The computer-readable storage medium may be, for example, the memory 260.

The computer readable recoding medium may include a hard disk, a floppy disk, magnetic media (e.g., a magnetic tape), optical media (e.g., a Compact Disc Read Only Memory (CD-ROM) and a Digital Versatile Disc (DVD)), magneto-optical media (e.g., a floptical disk), a hardware device (e.g., a Read Only Memory (ROM), a Random Access Memory (RAM), a flash memory), and the like. In addition, the program instructions may include high class language codes, which can be executed in a computer by using an interpreter, as well as machine codes made by a compiler. The aforementioned hardware device may be configured to operate as one or more software modules in order to perform the operation of the present disclosure, and vice versa.

The programming module according to the present disclosure may include one or more of the aforementioned components or may further include other additional components, or some of the aforementioned components may be omitted. Operations executed by a module, a programming module, or other component elements according to various embodiments of the present disclosure may be executed sequentially, in parallel, repeatedly, or in a heuristic manner. Furthermore, some operations may be executed in a different order or may be omitted, or other operations may be added.

Various embodiments disclosed herein are provided merely to easily describe technical details of the present disclosure and to help the understanding of the present disclosure, and are not intended to limit the scope of the present disclosure. Therefore, it should be construed that all modifications and changes or modified and changed forms based on the technical idea of the present disclosure fall within the scope of the present disclosure.

The invention claimed is:

1. A wireless power receiver comprising:
a power reception circuit configured to wirelessly receive alternating current (AC) power based on an electromagnetic wave output from a wireless power transmitter;
a rectifier configured to rectify the AC power into a direct current (DC) power;
a DC/DC converter configured to convert a voltage of the DC power into a predetermined level;
a charger configured to charge a battery with the converted DC power:
an AC ground connected to at least a part of the power reception circuit and the rectifier to receive at least part of the AC power; and
a DC ground connected to at least a part of the DC/DC converter and the charger to receive at least part of the DC power,
wherein the AC ground and the DC ground are arranged on different PCB layers from each other, respectively.

2. The wireless power receiver of claim 1,
wherein the DC ground comprises a first DC ground and a second DC ground, and
the wireless power receiver comprises:
a first PCB layer including the first DC ground;
a second PCB layer including the AC ground; and
a third PCB layer including the second DC ground.

3. The wireless power receiver of claim 2,
wherein the second PCB layer is disposed over the third PCB layer, and the first PCB layer is disposed over the second PCB layer.

4. The wireless power receiver of claim 1,
further comprising a ground in a closed loop shape surrounding the AC ground,
wherein the ground is disposed on a same PCB layer as the AC ground.

5. The wireless power receiver of claim 1,
further comprising a ground disposed adjacent to the AC ground,
wherein the ground is disposed on a same PCB layer as the AC ground.

6. The wireless power receiver of claim 1,
wherein the AC ground comprises a conductor having a first area, and
the first area is configured such that the stability of a signal processed by the wireless power receiver exceeds a predetermined threshold value.

7. The wireless power receiver of claim 1, wherein:
the AC ground comprises a plurality of conductors spaced apart from one another, each of the conductors having a second area;
the sum of areas of the plurality of conductors spaced apart corresponds to a first area; and
the first area is configured such that the stability of a signal processed by the wireless power receiver exceeds a predetermined threshold value.

8. A wireless power transmitter comprising:
a power provider configured to provide direct current (DC) power;
an amplifier configured to amplify the DC power with a predetermined gain;
an inverter configured to invert the amplified DC power into alternating current (AC) power;
a power transmission circuit configured to output an electromagnetic wave using the AC power;
an AC ground connected to at least a part of the power transmission circuit and the inverter to receive at least part of the AC power; and a DC ground connected to at least a part of the power provider and the amplifier to receive at least part of the DC power,
wherein the AC ground and the DC ground are arranged on different PCB layers from each other, respectively.

9. The wireless power transmitter of claim 8,
wherein the DC ground comprises a first DC ground and a second DC ground, and
the wireless power transmitter comprises:
a first PCB layer including the first DC ground;
a second PCB layer including the AC ground; and
a third PCB layer including the second DC ground.

10. The wireless power transmitter of claim 9,
wherein the second PCB layer is disposed over the third PCB layer, and the first PCB layer is disposed over the second PCB layer.

11. The wireless power transmitter of claim 8,
further comprising a ground in a closed loop shape surrounding the AC ground,
wherein the ground is disposed on the same PCB layer as the AC ground.

12. The wireless power transmitter of claim 8,
further comprising a ground disposed adjacent to the ground,
wherein the ground is disposed on the same PCB layer as the AC ground.

13. The wireless power transmitter of claim 8,
wherein the AC ground comprises a conductor having a first area, and
the first area is configured such that the stability of a signal processed by the wireless power transmitter exceeds a predetermined threshold value.

14. The wireless power transmitter of claim 8, wherein:
the AC ground comprises a plurality of conductors spaced apart from one another, each of the conductors having a second area;
the sum of areas of the plurality of conductors spaced apart corresponds to a first area; and
the first area is configured such that the stability of a signal processed by the wireless power transmitter exceeds a predetermined threshold value.

* * * * *